United States Patent
Nagai et al.

(10) Patent No.: US 9,350,092 B2
(45) Date of Patent: May 24, 2016

(54) ELECTRONIC SUBSTRATE CONNECTING STRUCTURE

(71) Applicant: KAYABA INDUSTRY CO., LTD., Minato-ku, Tokyo (JP)

(72) Inventors: Yuki Nagai, Kanagawa (JP); Taroh Matsumae, Kanagawa (JP)

(73) Assignee: KYB Corporation, Tokyo (JP)

( * ) Notice: Subject to any disclaimer, the term of this patent is extended or adjusted under 35 U.S.C. 154(b) by 0 days.

(21) Appl. No.: 14/388,227

(22) PCT Filed: Mar. 7, 2013

(86) PCT No.: PCT/JP2013/056332
§ 371 (c)(1),
(2) Date: Sep. 25, 2014

(87) PCT Pub. No.: WO2013/146170
PCT Pub. Date: Oct. 3, 2013

(65) Prior Publication Data
US 2015/0303596 A1 Oct. 22, 2015

(30) Foreign Application Priority Data
Mar. 29, 2012 (JP) .................. 2012-076354

(51) Int. Cl.
*H05K 1/00* (2006.01)
*H01R 12/52* (2011.01)
(Continued)

(52) U.S. Cl.
CPC .............. *H01R 12/523* (2013.01); *H01R 12/58* (2013.01); *H01R 12/73* (2013.01); *H05K 1/144* (2013.01);
(Continued)

(58) Field of Classification Search
CPC ...................................... H05K 3/368
USPC .......................... 439/75, 943, 76.2
See application file for complete search history.

(56) References Cited

U.S. PATENT DOCUMENTS 5,995,380 A * 11/1999 Maue ............... B60R 16/0238
174/254
6,322,374 B1 * 11/2001 Comtois ............... B81B 7/0006
439/69

(Continued)

FOREIGN PATENT DOCUMENTS

JP 6218971 U 2/1987
JP 392363 U 9/1991

(Continued)

OTHER PUBLICATIONS

International Search Report and Written Opinion mailed Jun. 4, 2013, corresponding to International patent application No. PCT/JP2013/056332.

(Continued)

*Primary Examiner* — Abdullah Riyami
*Assistant Examiner* — Thang Nguyen
(74) *Attorney, Agent, or Firm* — Hauptman Ham, LLP

(57) ABSTRACT

An electronic substrate connecting structure is used to electrically connect a pair of electronic substrates arranged to face each other. The electronic substrate connecting structure includes a plurality of pins erected on one of the electronic substrates to electrically connect the one of the electronic substrates and the other electronic substrate, and a pin guide that has a plurality of guide holes where the pins are inserted and defines positions of the pins such that the pins are connectable to the other electronic substrate while the pins are installed in the one of the electronic substrates.

11 Claims, 6 Drawing Sheets

(51) Int. Cl.
  *H01R 12/58* (2011.01)
  *H05K 1/14* (2006.01)
  *H05K 3/36* (2006.01)
  *H01R 12/73* (2011.01)

(52) U.S. Cl.
  CPC ............... *H05K 3/368* (2013.01); *H01R 12/52* (2013.01); *H05K 2201/10295* (2013.01); *H05K 2201/10863* (2013.01); *H05K 2203/167* (2013.01)

(56) References Cited

U.S. PATENT DOCUMENTS

| | | | |
|---|---|---|---|
| 6,419,516 B1 * | 7/2002 | Parcet | H01R 12/515 439/364 |
| 6,773,269 B1 * | 8/2004 | Downes | H05K 3/368 439/55 |
| 6,878,004 B2 * | 4/2005 | Oh | H01H 85/2035 439/250 |
| 7,740,489 B2 * | 6/2010 | Trout | H01R 12/523 439/74 |
| 2004/0157479 A1 * | 8/2004 | Aoki | H01R 12/7064 439/75 |
| 2006/0035490 A1 * | 2/2006 | Linssen | H01F 5/04 439/75 |
| 2008/0153325 A1 * | 6/2008 | Boileau | H01R 4/06 439/75 |
| 2009/0011622 A1 * | 1/2009 | Lappoehn | H01R 12/716 439/75 |
| 2010/0020516 A1 * | 1/2010 | Kishino | H05K 1/144 361/803 |
| 2010/0093194 A1 * | 4/2010 | Trout | H01R 13/6471 439/75 |
| 2013/0084751 A1 * | 4/2013 | Shindo | H01R 13/6315 439/626 |

FOREIGN PATENT DOCUMENTS

| | | |
|---|---|---|
| JP | 8504056 A | 4/1996 |
| JP | 10308570 A | 11/1998 |
| JP | 4114195 B2 | 7/2008 |
| JP | 2010035304 A | 2/2010 |

OTHER PUBLICATIONS

Office Action mailed Jul. 29, 2014, corresponding to Japanese patent application No. JP2012-076354.

* cited by examiner

US 9,350,092 B2

ELECTRONIC SUBSTRATE CONNECTING STRUCTURE

TECHNICAL FIELD

This invention relates to a connecting structure for electrically connecting a pair of electronic substrates.

BACKGROUND ART

In the related art, a structure has been employed, in which metal pins are mounted and electrically connected for exchanging power or signals between a pair of electronic substrates provided with electronic circuits. In JP2010-35304A, there is disclosed a surface mount type busbar having a base end soldered to a front face of one of the substrates and a tip connected to the other substrate.

SUMMARY OF INVENTION

However, in the busbar disclosed in JP2010-35304A, in order to connect the other substrate to the busbar erected on the one substrate, a position of the tip of the busbar may not match an installation position on the other substrate due to an error in an installation position or an angle of the busbar. For this reason, it is necessary to perform positioning while the angle of the busbar is manually corrected or employ a positioning jig. This may degrade workability.

In view of the aforementioned problems, it is therefore an object of this invention to improve workability to electrically connect a pair of electronic substrates.

According to one aspect of this invention, an electronic substrate connecting structure for electrically connecting a pair of electronic substrates arranged to face each other is provided. The electronic substrate connecting structure includes a plurality of pins erected on one of the electronic substrates to electrically connect the one of the electronic substrates and the other electronic substrate, and a pin guide that has a plurality of guide holes where the pins are inserted and defines positions of the pins such that the pins are connectable to the other electronic substrate while the pins are installed in the one of the electronic substrates.

The details as well as other features and advantages of this invention are set forth in the remainder of the specification and are shown in the accompanying drawings.

DESCRIPTION OF EMBODIMENTS

Figure 1:
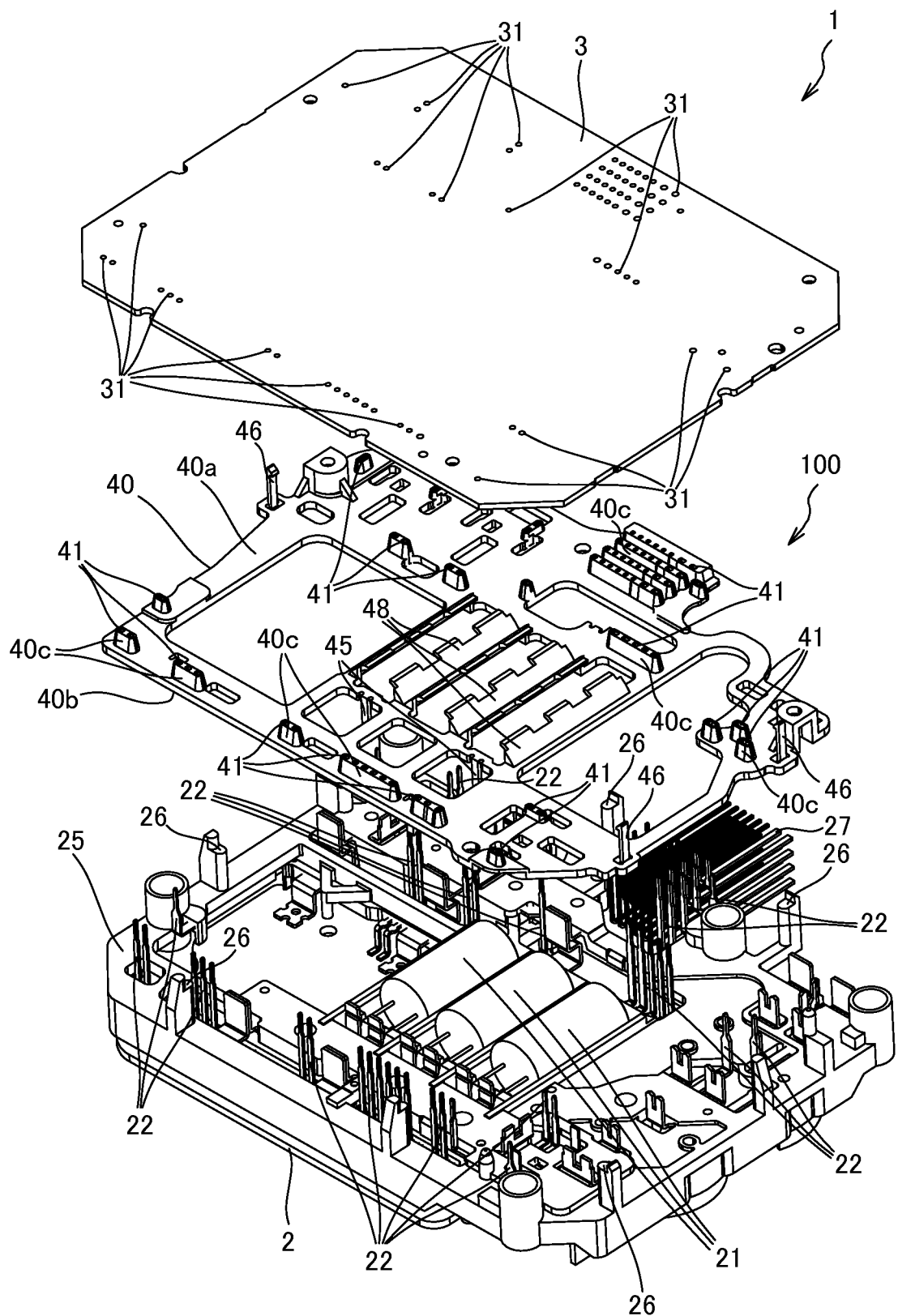
FIG. 1 is an exploded perspective view illustrating an electronic control unit obtained by applying an electronic substrate connecting structure according to an embodiment of this invention.

An embodiment of this invention will now be described with reference to the accompanying drawings.

First, an electronic control unit 1 obtained by applying an electronic substrate connecting structure 100 (hereinafter, simply referred to as a "connecting structure") according to an embodiment of the invention will be described with reference to FIG. 1.

The electronic control unit 1 includes: a power supply substrate 2, as one of the electronic substrates, that controls power supplied to a control target (not illustrated); a control substrate 3, as the other electronic substrate, that controls the control target by transmitting and receiving a control signal; and a casing (not illustrated) that houses the power supply substrate 2 and the control substrate 3. The casing includes a housing portion that houses the power supply substrate 2 and a lid portion that covers the control substrate 3 to close the housing portion.

The electronic control unit 1 may include, for example, an engine control unit (ECU) that controls a vehicle engine as a control target, an electronic control unit (ECU) that controls an electric power steering device as a control target, or the like.

The power supply substrate 2 is a planar printed substrate formed of a high heat-dissipating metal such as aluminum. The power supply substrate 2 is formed in an approximately rectangular shape and has an electronic circuit formed on a front face thereof. A cylindrical capacitor 21 for adjusting a voltage constantly by removing a noise and other electronic components (not illustrated) are mounted on the front face of the power supply substrate 2. In addition, a plurality of pins 22 for electrically connecting the power supply substrate 2 and the control substrate 3 are mounted on the front face of the power supply substrate 2. The pins 22 will be described in detail below along with the connecting structure 100.

The control substrate 3 is a planar printed substrate formed of resin such as a glass epoxy resin. The control substrate 3 is formed in an approximately rectangular shape, and an electronic circuit is formed in the rear face thereof. In the control substrate 3, the planar portion of the rear face is arranged to face a planar portion of the front face of the power supply substrate 2. In the control substrate 3, through-holes 31 are formed as a plurality of terminals connected to each pin 22.

The through-holes 31 are formed to match design positions of the tips of the pins 22. The through-holes 31 are formed to have nearly the same shapes as the exteriors of the pins 22. The tips of the pins 22 are inserted into the through-holes 31 and are bonded thereto through flow soldering.

Here, when the pin 22 erected on the power supply substrate 2 is inserted into the through-hole 31 of the control substrate 3, the tip of the pin 22 may not match the position of the through-hole 31 due to an error in a installation position or an angle of the pin 22 relative to the power supply substrate 2. In this regard, in the electronic control unit 1, workability for inserting the tip of the pin 22 into the through-hole 31 is improved using a connecting structure 100.

Next, the connecting structure 100 will be described with reference to FIGS. 1 to 4.

The connecting structure 100 is used to electrically connect the power supply substrate 2 and the control substrate 3. That is, using the connecting structure 100, a pair of the electronic substrates arranged to face each other are electrically connected.

The connecting structure 100 includes: a plurality of pins 22 erected on the power supply substrate 2 to electrically connect the power supply substrate 2 and the control substrate 3; a pin holding member 25 that collectively holds a plurality of pins 22 in the power supply substrate 2; and a pin guide 40 that defines positions of the pins 22 such that the pins can access the control substrate 3 while they are installed in the power supply substrate 2.

The pins 22 are metal bar-like members having base ends mounted on the front face of the power supply substrate 2 and tips inserted into the control substrate 3. The base ends of the pins 22 are soldered to the front face of the power supply substrate 2 perpendicularly. The tips of the pins 22 are inserted into the through-holes 31 of the control substrate 3 and are soldered thereto. A plurality of pins 22 are integrally molded using the pin holding member 25.

The pin holding member 25 is a resin member for holding a plurality of pins 22. The pin holding member 25 is formed in a rectangular shape approximately matching the control substrate 3. The pin holding member 25 has a thickness sufficient to hold the pins 22. The pin holding member 25 is fixed to the power supply substrate 2 by soldering the pins 22. The pin holding member 25 is fixed to the inner surface of the housing portion of the casing by fastening a bolt. Alternatively, all of the pins 22 may not be held by the pin holding member 25. Instead, the pins 22 may be held by the pin holding member 25 and another subsidiary holding member.

The pin holding member 25 includes: a seat portion 26 where the control substrate 3 seats while the control substrate 3 is installed; and a connector 27 for connecting the power supply substrate 2 and the control substrate 3 to an external power supply (not illustrated) or a control target.

The seat portions 26 are erected on a plurality of places of the surface of the pin holding member 25 facing the control substrate 3. Six seat portions 26 are formed in the pin holding member 25 (refer to FIG. 5). The control substrate 3 seats on the seat portion 26 while the electronic control unit 1 is assembled. As a result, a distance between the power supply substrate 2 and the control substrate 3 is defined as a predetermined value.

The connector 27 has a plurality of pins protruding to the side face of the pin holding member 25. The connector 27 is a terminal that receives power supplied from a power supply and receives or transmits a control signal from or to a control target. The connector 27 is formed to protrude to the outside from the side face of the housing portion of the casing.

The pin guide 40 is an approximately planar resin member having a front face 40a facing the control substrate 3 and a rear face 40b facing the power supply substrate 2. The pin guide 40 is formed in an approximately rectangular shape across overall positions of the pins 22. The pin guide 40 corrects an inclination angle of the pin 22 relative to the power supply substrate 2 while it is installed in the power supply substrate 2 by interposing the pin holding member 25. Specifically, the pin guide 40 is installed such that the tips 22a of the pins 22 (refer to FIG. 4) match the positions of the through-holes 31 of the control substrate 3.

The pin guide 40 includes: a plurality of protrusions 40c protruding to the control substrate 3; a plurality of guide holes 41 formed inside the protrusions 40c, where each of the pins 22 is inserted; a claw portion 45 as a first claw portion that is engaged with the pin holding member 25 while the pins 22 are inserted to define a relative position; a claw portion 46 as a second claw portion that holds the control substrate 3 between the seat portions 26; and a capacitor holding portion 48 that holds a capacitor 21 mounted on the power supply substrate 2.

The protrusion 40c is tapered to be thin toward the control substrate 3. The control substrate 3 seats on the tip 40d of the protrusion 40c while the control substrate 3 is installed. As a result, it is possible to support the control substrate 3 in a plurality of places. Alternatively, the control substrate 3 may be supported only by the seat portions 26 such that the tip 40d of the protrusion 40c does not abut on the control substrate 3 while the control substrate 3 is installed.

Figure 4:
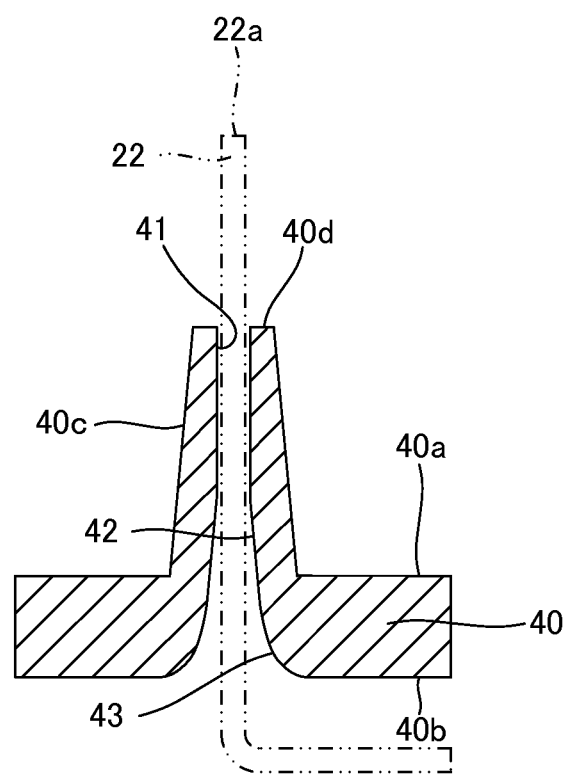
FIG. 4 is a cross-sectional view illustrating a guide hole of the pin guide.

As illustrated in FIG. 4, the guide hole 41 is formed in the inner circumference of the protrusion 40c protruding from the front face 40a of the pin guide 40 to the control substrate 3. The guide hole 41 includes: a tapered portion 42 formed in the inner circumference and narrowed from the power supply substrate 2 side to the control substrate 3 side to allow the control substrate 3 side to match an exterior of the pin 22; and a curved portion 43 curved from the inner circumference of the end portion, where the pin 22 is inserted, toward the outer circumference. The guide hole 41 is formed to match the position of the through-hole 31 of the control substrate 3 in the tip 40d of the protrusion 40c.

As the pin 22 is inserted from the rear face 40b side of the pin guide 40, the tapered portion 42 corrects an inclination angle to allow the tip 22a of the pin 22 to match the position of the through-hole 31 while the tapered portion 42 abuts on the pin 22. The tapered portion 42 is opened most widely in the rear face 40b side. Therefore, the pin 22 can be easily inserted into the guide hole 41 even when there is an error in an installation position or an angle of the pin 22.

The curved portion 43 is formed in the inlet of the rear face 40b side of the guide hole 41. The curved portion 43 has a curved surface that smoothly connects the rear face 40b of the pin guide 40 and the tapered portion 42. The curved portion 43 widely opens the inlet of the guide hole 41 to the outer circumference. Therefore, compared to a case where the tapered portion 42 is solely provided, it is possible to further easily insert the pin 22 into the guide hole 41 even when there is an error in the installation position or the angle of the pin 22.

Figure 3A:
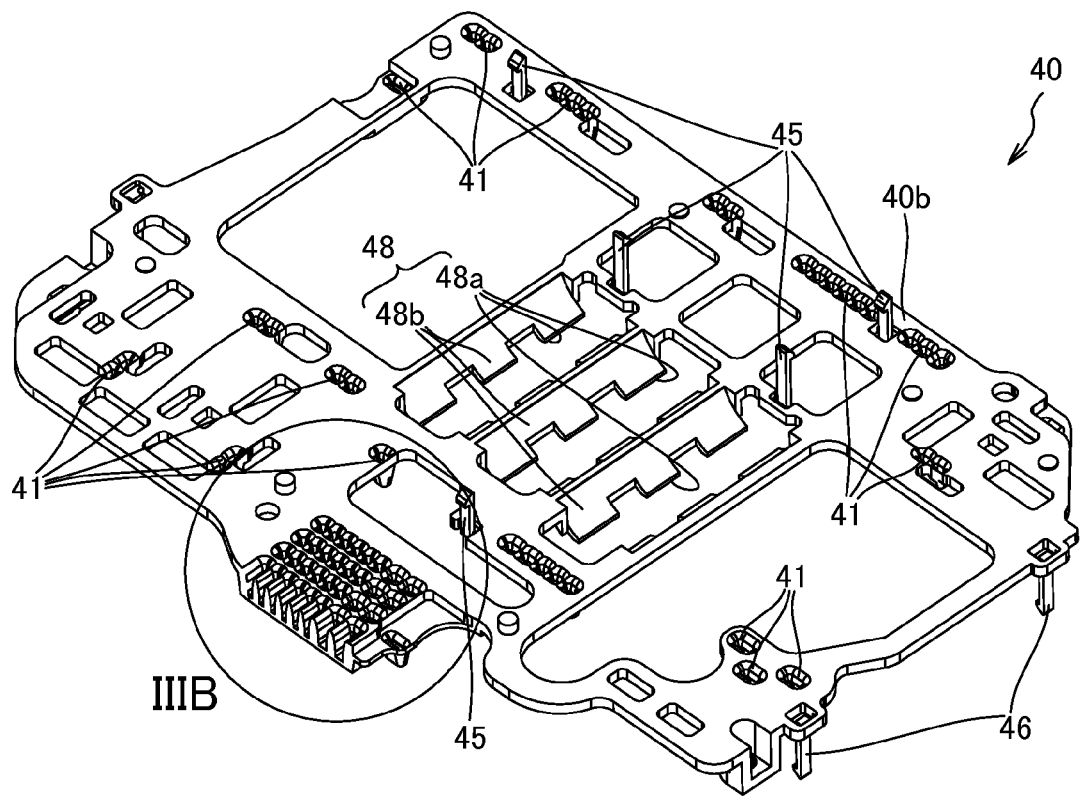
FIG. 3A is a perspective view illustrating a rear face of the pin guide.
Figure 3B:
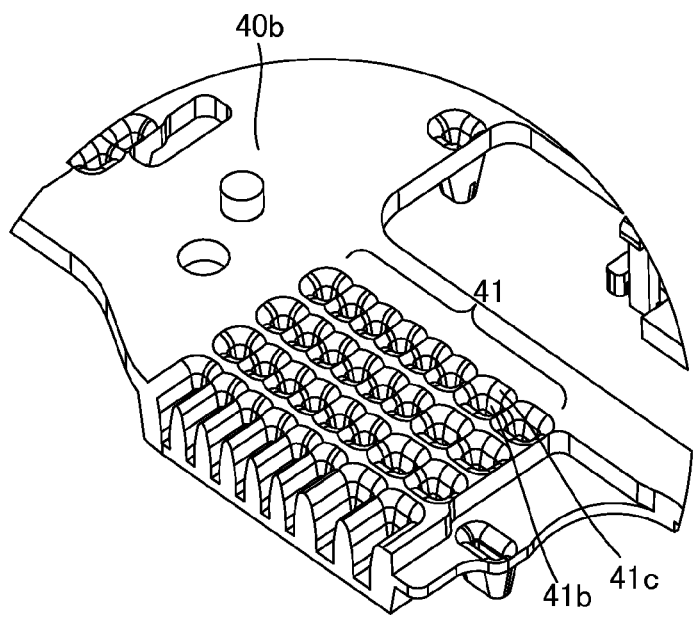
FIG. 3B is an enlarged view illustrating a portion IIIB of FIG. 3A.

As illustrated in FIGS. 1 and 3A, the claw portions 45 protrude toward the power supply substrate 2 from the rear face 40b of the pin guide 40. The claw portions 45 are formed in at least two opposite places and hold the pin holding member 25 such that a part of or the entire portion of the pin holding member 25 are interposed when the claw portions 45 are engaged with the pin holding member 25. In the pin guide 40, the claw portions 45 are formed in five places and are hold the pin holding member 25 by interposing a part thereof.

The claw portion 45 is engaged with an engagement portion (not illustrated) formed in the pin holding member 25 when the pin 22 is inserted into the guide hole 41, and the pin guide 40 approaches the pin holding member 25 by a predetermined position. As a result, the pin guide 40 is fixed to the pin holding member 25. It is noted that the claw portion 45 may be engaged with the power supply substrate 2 instead of engagement between the claw portion 45 and the pin holding member 25.

Figure 2A:
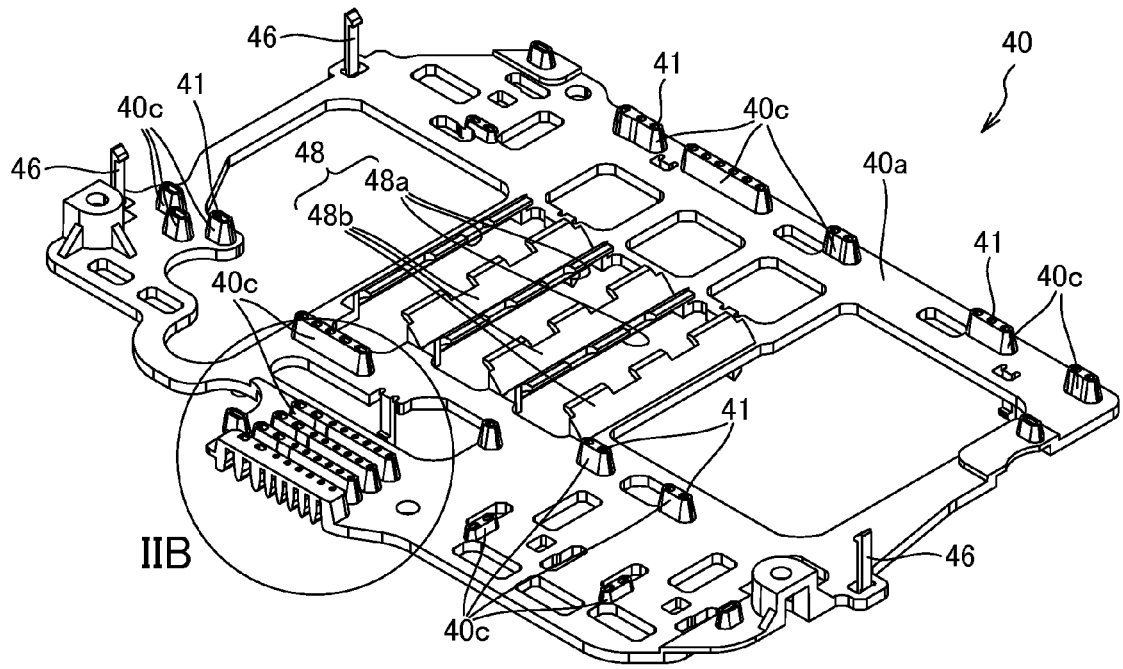
FIG. 2A is a perspective view illustrating a front face of a pin guide.
Figure 2B:
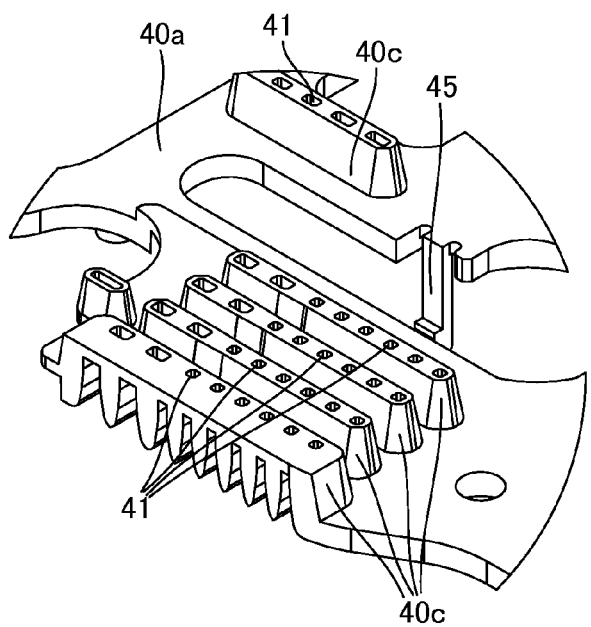
FIG. 2B is an enlarged view illustrating a portion IIB of FIG. 2A.

Meanwhile, as illustrated in FIGS. 1 and 2A, the claw portion 46 protrudes from the front face 40a of the pin guide 40 toward the control substrate 3. The claw portions 46 are formed in at least two opposite places and hold the control substrate 3 by interposing a part of or the entire portion of the control substrate 3 when the claw portions 46 are engaged with the control substrate 3. In the pin guide 40, the claw portions 46 are formed in three places and hold the control substrate 3 by interposing the entire longitudinal direction of the control substrate 3.

When the control substrate 3 is installed from the upper side of the pin guide 40, the control substrate 3 seats on the seat portions 26 of the pin holding member 25, and the claw portions 46 are engaged with the control substrate 3. As a result, the control substrate 3 is fixed between the seat portions 26 and the claw portions 46.

As illustrated in FIGS. 2A to 3B, the capacitor holding portion 48 includes: an opening 48a opened in a rectangular shape on the front face 40a of the pin guide 40; and a pair of erectable portions 48b erected to cover the opening 48a from a pair of facing sides of the opening 48a. The capacitor holding portion 48 holds the capacitor 21 protruding from the opening 48a such that the erectable portions 48b abut on the outer circumferences of the side faces of the capacitor 21. As a result, it is possible to prevent the capacitor 21 as a large-sized component mounted on the control substrate 3 from falling off when the electronic control unit 1 is turned over to perform flow soldering as described below.

Next, an assembling sequence of the electronic control unit 1 applied to the connecting structure 100 will be described with reference to FIGS. 5 and 6.

First, the power supply substrate 2 and the pin holding member 25 are assembled. Specifically, base ends of each pin 22 held by the pin holding member 25 are soldered to a terminal portion formed on the front face of the power supply substrate 2. In this state, the pin holding member 25 integrated with the power supply substrate 2 is housed in the housing portion of the casing using a bolt.

Alternatively, the pin 22 held by the pin holding member 25 may not be directly soldered to the power supply substrate 2. Instead, a base end of the pin 22 held by another subsidiary holding member may be soldered to the power supply substrate 2, and the pin 22 held by the pin holding member 25 may be welded to the pin 22 of the subsidiary holding member.

Figure 5:
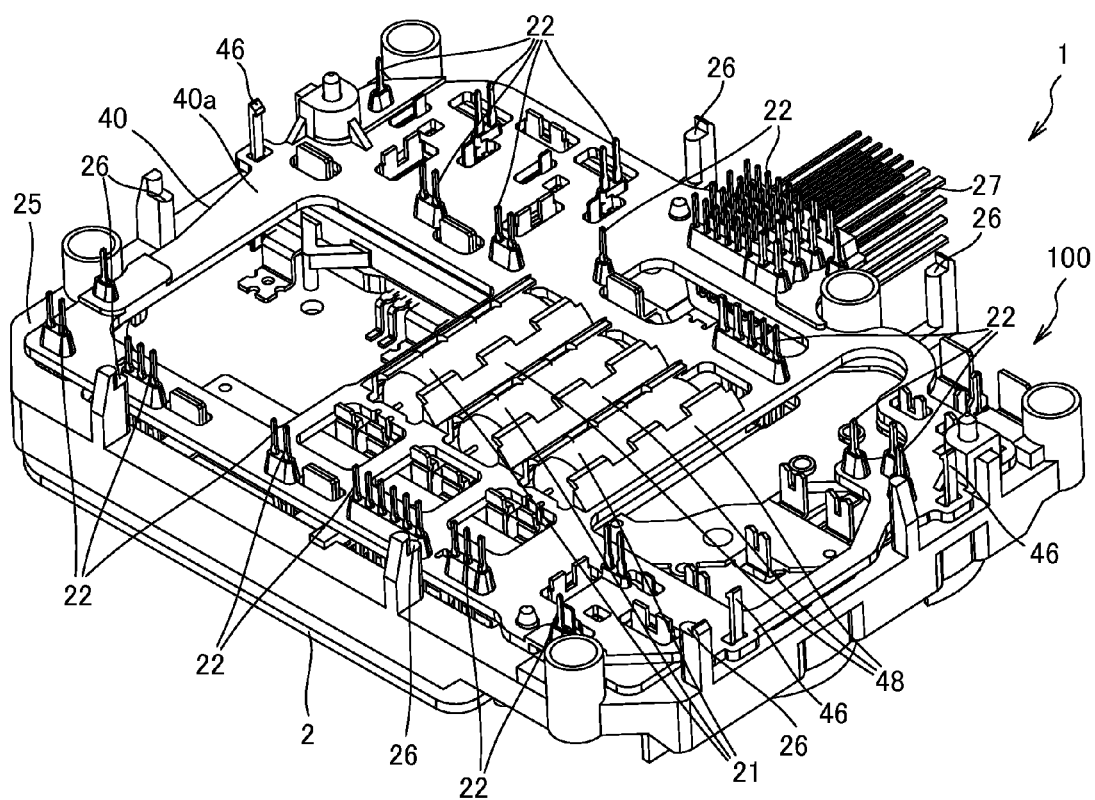
FIG. 5 is a perspective view illustrating a state that a pin holding member and a pin guide are assembled in one of the electronic substrates.

Then, as illustrated in FIG. 5, the pin guide 40 is assembled. Specifically, the pin guide 40 is lowered from the upside above the pin holding member 25 such that the tip 22a of the pin 22 erected on the power supply substrate 2 can be inserted into the corresponding guide hole 41. As the pin 22 is inserted into the guide hole 41, and the claw portion 45 of the pin guide 40 is engaged with the pin holding member 25, the assembling of the pin guide 40 is completed.

Here, the tapered portion 42 and the curved portion 43 are formed in the guide hole 41 of the pin guide 40. For this reason, for example, when there is an error in the installation angle of the pin 22, the inclination angle is corrected such that, first, the tip 22a of the pin 22 makes contact with the curved portion 43, to be inserted into the tapered portion 42 of the guide hole 41. In addition, while the pin 22 abuts on the inner circumference of the tapered portion 42, the inclination angle is smoothly corrected. When the pin 22 protrudes from the tip 40d, the inclination angle is corrected to match the position of the through-hole 31 of the control substrate 3.

Figure 6:
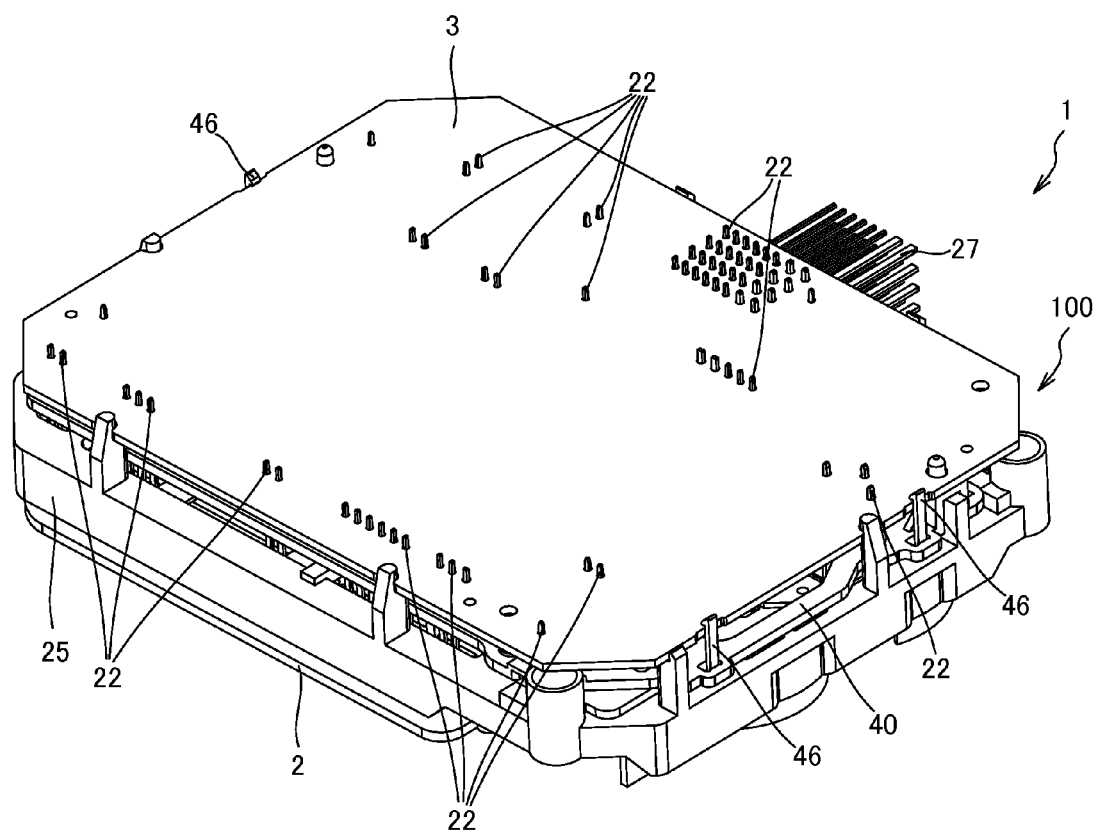
FIG. 6 is a perspective view illustrating an electronic control unit obtained by applying an electronic substrate connecting structure according to an embodiment of this invention.

Then, as illustrated in FIG. 6, the control substrate 3 is assembled. Specifically, the control substrate 3 is lowered from the upside and is pressedly inserted so that the control substrate 3 seats on the seat portion 26 of the pin holding member 25. In this case, since the tips 22a of each pin 22 already match the position of the through-holes 31 due to installation of the pin guide 40, it is possible to easily install the control substrate 3.

As the control substrate 3 seats on the seat portion 26, the claw portion 46 is engaged with the control substrate 3. As a result, the assembling of the control substrate 3 is completed.

As described above, the pin 22 erected on the power supply substrate 2 is positioned such that it can be connected to the control substrate 3 when it is inserted into the guide hole 41 of the pin guide 40. Therefore, it is not necessary to correct an angle or using a positioning jig in order to position the pin 22 when the control substrate 3 is installed. As a result, it is possible to improve workability for electrically connecting the power supply substrate 2 and the control substrate 3.

After the control substrate 3 is assembled, the electronic control unit 1 is turned over such that the control substrate 3 faces the ground, and the flow soldering is performed. As a result, the pin 22 inserted into the through-hole 31 is soldered to the control substrate 3, and the power supply substrate 2 and the control substrate 3 are electrically connected to each other.

In this case, the pin guide 40 is fixed to the pin holding member 25 through engagement of the claw portion 45. In addition, the control substrate 3 is held between the pin holding member 25 and the pin guide 40 as the claw portion 46 is engaged. Therefore, even when the electronic control unit 1 is turned over, the pin guide 40 or the control substrate 3 does not fall off.

The capacitor 21 mounted on the power supply substrate 2 is held by the capacitor holding portion 48 of the pin guide 40. Therefore, the capacitor 21 does not fall off even when the electronic control unit 1 is turned over.

Alternatively, the capacitor 21 may not be directly mounted on the power supply substrate 2. Instead, the capacitor 21 may be welded to the pin 22 held by the pin holding member 25 for electrical connection.

After the power supply substrate 2 and the control substrate 3 are electrically connected to each other through a plurality of pins 22 by performing flow soldering, a lid is installed in the housing portion of the casing to cover it. Through the assembling sequence described above, the electronic control unit 1 is completed.

According to the embodiments described above, the following effects can be obtained.

The pin 22 erected on the power supply substrate 2 is inserted into the guide hole 41 of the pin guide 40 and is positioned accessibly to the control substrate 3. Therefore, it is not necessary to correct an angle or use a positioning jig in order to position the pin 22 when the control substrate 3 is installed. As a result, it is possible to improve workability for electrically connecting the power supply substrate 2 and the control substrate 3.

Embodiments of this invention were described above, but the above embodiments are merely examples of applications of this invention, and the technical scope of this invention is not limited to the specific constitutions of the above embodiments.

This application claims priority based on Japanese Patent Application No. 2012-076354 filed with the Japan Patent Office on Mar. 29, 2012, the entire contents of which are incorporated into this specification.

The embodiments of this invention in which an exclusive property or privilege is claimed are defined as follows:

1. An electronic substrate connecting structure for electrically connecting first and second electronic substrates arranged to face each other, said electronic substrate connecting structure comprising:
    a plurality of pins erected on the first electronic substrate and configured to electrically connect the first electronic substrate and the second electronic substrate;
    a pin guide that has a plurality of guide holes where the pins are inserted, respectively, and defines positions of the pins such that the pins are connectable to the second electronic substrate while the pins are installed in the first electronic substrate; and a pin holding member that collectively holds the plurality of the pins erected on the first electronic substrate in the first electronic substrate, wherein the pin holding member has a seat portion where the second electronic substrate seats while the second electronic substrate is installed, and the pin guide has a claw portion that is configured to hold the second electronic substrate along with the seat portion.

2. The electronic substrate connecting structure according to claim 1, wherein the second electronic substrate has a plurality of terminal portions where the pins are connected, and the pin guide causes tips of the pins to match positions of the terminal portions while the pin guide is installed in the first electronic substrate.

3. The electronic substrate connecting structure according to claim 1, wherein each of the guide holes has a tapered portion formed in an inner circumference and narrowed from the first electronic substrate toward the second electronic substrate to allow a second electronic substrate side to approximately match an exterior of the respective pin.

4. The electronic substrate connecting structure according to claim 1, wherein each of the guide holes has a curved portion in an end portion where the respective pin is inserted.

5. The electronic substrate connecting structure according to claim 1, wherein the pin guide has a further claw portion engaged with the pin holding member or the first electronic substrate to define a relative position while the pins are inserted in the guide holes, respectively.

6. The electronic substrate connecting structure according to claim 1, wherein the pin guide has a plurality of protrusions that are erected toward the second electronic substrate and internally have the guide holes, respectively, and the second electronic substrate seats on tips of the protrusions while the second electronic substrate is installed.

7. An electronic substrate connecting structure for electrically connecting first and second electronic substrates arranged to face each other, said electronic substrate connecting structure comprising:

a plurality of pins erected on the first electronic substrate and configured to electrically connect the first electronic substrate and the second electronic substrate; and a pin guide that has a plurality of guide holes where the pins are inserted, respectively, and defines positions of the pins such that the pins are connectable to the second electronic substrate while the pins are installed in the first electronic substrate, wherein the first electronic substrate is a power supply substrate that is configured to control power, the second electronic substrate is a control substrate that is configured to control a control target, and the pin guide has a capacitor holding portion that is configured to hold a capacitor electrically connected to the power supply substrate.

8. The electronic substrate connecting structure according to claim 7, wherein the second electronic substrate has a plurality of terminal portions where the pins are connected, and the pin guide causes tips of the pins to match positions of the terminal portions while the pin guide is installed in the first electronic substrate.

9. The electronic substrate connecting structure according to claim 7, wherein each of the guide holes has a tapered portion formed in an inner circumference and narrowed from the first electronic substrate toward the second electronic substrate to allow a second electronic substrate side to approximately match an exterior of the respective pin.

10. The electronic substrate connecting structure according to claim 7, wherein each of the guide holes has a curved portion in an end portion where the respective pin is inserted.

11. The electronic substrate connecting structure according to claim 7, wherein the pin guide has a plurality of protrusions that are erected toward the second electronic substrate and internally have the guide holes, respectively, and the second electronic substrate seats on tips of the protrusions while the second electronic substrate is installed.

* * * * *